(12) United States Patent
Corbeil, Jr. et al.

(10) Patent No.: US 7,406,671 B2
(45) Date of Patent: Jul. 29, 2008

(54) METHOD FOR PERFORMING DESIGN RULE CHECK OF INTEGRATED CIRCUIT

(75) Inventors: John D. Corbeil, Jr., Fort Collins, CO (US); Michael J. Saunders, Fort Collins, CO (US)

(73) Assignee: LSI Corporation, Milpitas, CA (US)

( * ) Notice: Subject to any disclaimer, the term of this patent is extended or adjusted under 35 U.S.C. 154(b) by 184 days.

(21) Appl. No.: 11/243,839

(22) Filed: Oct. 5, 2005

(65) Prior Publication Data

US 2007/0079269 A1 Apr. 5, 2007

(51) Int. Cl.
*G06F 17/50* (2006.01)
(52) U.S. Cl. .......................................................... 716/5
(58) Field of Classification Search ...................... 716/5
See application file for complete search history.

(56) References Cited

U.S. PATENT DOCUMENTS

| | | | | |
|---|---|---|---|---|
| 6,009,251 A * | 12/1999 | Ho et al. | | 716/5 |
| 6,418,551 B1 * | 7/2002 | McKay et al. | | 716/5 |
| 6,505,327 B2 * | 1/2003 | Lin | | 716/5 |
| 6,560,766 B2 * | 5/2003 | Pierrat et al. | | 716/19 |
| 6,606,735 B1 * | 8/2003 | Richardson et al. | | 716/5 |
| 6,721,928 B2 * | 4/2004 | Pierrat et al. | | 716/4 |
| 6,756,242 B1 * | 6/2004 | Regan | | 438/14 |
| 6,883,149 B2 | 4/2005 | Li et al. | | 716/4 |
| 6,892,368 B2 * | 5/2005 | Li et al. | | 716/5 |
| 6,941,530 B2 * | 9/2005 | Joshi et al. | | 716/4 |
| 6,948,145 B2 * | 9/2005 | Brown et al. | | 716/12 |
| 7,082,588 B2 * | 7/2006 | Scheffer et al. | | 716/8 |
| 7,096,439 B2 * | 8/2006 | Tsai et al. | | 716/5 |
| 7,155,689 B2 * | 12/2006 | Pierrat et al. | | 716/4 |
| 7,162,703 B1 * | 1/2007 | Aik | | 716/5 |
| 7,171,639 B2 * | 1/2007 | Genz et al. | | 716/5 |
| 2001/0052107 A1 * | 12/2001 | Anderson et al. | | 716/4 |
| 2002/0026621 A1 * | 2/2002 | Mukai | | 716/2 |
| 2002/0100005 A1 * | 7/2002 | Anderson et al. | | 716/5 |
| 2002/0138813 A1 * | 9/2002 | Teh et al. | | 716/5 |
| 2003/0061583 A1 * | 3/2003 | Malhotra | | 716/5 |
| 2003/0182645 A1 * | 9/2003 | Fairbanks | | 716/5 |
| 2003/0196180 A1 * | 10/2003 | Li et al. | | 716/4 |
| 2004/0088660 A1 * | 5/2004 | Tran | | 716/5 |
| 2004/0199880 A1 * | 10/2004 | Kresh et al. | | 716/4 |
| 2005/0076316 A1 * | 4/2005 | Pierrat et al. | | 716/4 |
| 2005/0086619 A1 * | 4/2005 | Teh et al. | | 716/5 |
| 2005/0223347 A1 * | 10/2005 | Okuaki | | 716/5 |
| 2006/0265675 A1 * | 11/2006 | Wang | | 716/5 |

* cited by examiner

*Primary Examiner*—Stacy A Whitmore
(74) *Attorney, Agent, or Firm*—Suiter Swantz PC LLO

(57) ABSTRACT

The present invention provides a method for performing design rule check (DRC) of an integrated circuit. A design layout of the integrated circuit is provided. The integrated circuit includes a complex circuit. A DRC tool is used to compare a portion of the design layout with a reference layout containing an accurate implementation of the complex circuit. The portion of the design layout corresponds to the complex circuit.

17 Claims, 3 Drawing Sheets

METHOD FOR PERFORMING DESIGN RULE CHECK OF INTEGRATED CIRCUIT

FIELD OF THE INVENTION

The present invention generally relates to the field of integrated circuits, particularly to a method and system for performing design rule check (DRC) of an integrated circuit.

BACKGROUND OF THE INVENTION

Design of an electronic circuit, for example, an integrated circuit (IC), is a complicated and time consuming process. FIG. 1 illustrates a typical design flow 100 of an integrated circuit device from conception through the generation of a fabrication ready design layout. Generally, the design flow 100 starts with defining the design specifications or requirements such as required functionality and timing at step 102. The requirements of the design are implemented, for example, as a netlist or electronic circuit description at step 104. The implementation may be performed by, for example, schematic capture (drawing the design with a computer aided design tool) or more typically, utilizing a high level description language such as VHDL, Verilog®, and the like. The implemented design is simulated to verify design accuracy at step 106. Design implementation and simulation are iterative processes. For example, errors found by simulation are corrected by design implementation and re-simulated.

Once the design is verified for accuracy with simulation, a design layout of the design is created at step 108. The design layout describes the detailed design geometries and the relative positioning of each design layer to be used in actual fabrication. The design layout is very tightly linked to overall circuit performance (area, speed and power dissipation) because the physical structure defined by the design layout determines, for example, the transconductances of the transistors, the parasitic capacitances and resistances, and the silicon area which is used to realize a certain function. The detailed design layout requires a very intensive and time-consuming design effort and is typically performed utilizing specialized computer aided design (CAD) or Electronic Design Automation (EDA) tools.

The design layout is checked against a set of design rules in a design rule check (DRC) at step 110. The created design layout must conform to a complex set of design rules in order, for example, to ensure a lower probability of fabrication defects. The design rules specify, for example, how far apart the geometries on various layers must be, or how large or small various aspects of the layout must be for successful fabrication, given the tolerances and other limitations of the fabrication process. A design rule may be, for example, a minimum spacing amount between geometries and is typically closely associated to the technology, fabrication process and design characteristics. For example, different minimum spacing amounts between geometries may be specified for different sizes of geometries. DRC is a time-consuming iterative process that often requires manual manipulation and interaction by the designer. The designer performs design layout and DRC iteratively, reshaping and moving design geometries to correct all layout errors and achieve a DRC clean (violation free) design.

Circuit extraction is performed after the design layout is completed and error free at step 112. The extracted circuit identifies individual transistors and interconnections, for example, on various layers, as well as the parasitic resistances and capacitances present. A layout versus schematic check (LVS) is performed at step 114, where the extracted netlist is compared to the design implementation created in step 104. LVS ensures that the design layout is a correct realization of the intended circuit topology. Any errors such as unintended connections between transistors, or missing connections/devices, etc. must be corrected in the design layout before proceeding to post-layout simulation at step 116. The post-layout simulation is performed using the extracted netlist which provides a clear assessment of the circuit speed, the influence of circuit parasitics (such as parasitic capacitances and resistances), and any glitches that may occur due to signal delay mismatches. Once post-layout simulation is complete and all errors found by DRC are corrected, the design is ready for fabrication and is sent to a fabrication facility.

As electronic circuit densities increase and technology advances, for example, in deep sub-micron circuits, skilled designers attempt to maximize the utilization of the design layout and manufacturability and reliability of the circuit. For example, the density of a layer may be increased, additional vias may be added to interconnection areas, and the like. Creation of a design layout and performing DRC become critical time consuming processes. Performing a DRC and manipulation of the design layout often requires manual interaction from the designer. More reliable and automated techniques for improving the design layout are consistently desired.

In a modern semiconductor design technology, complex, custom circuits often require very specific, aggressive layout design rules. These rules are typically very difficult to verify with automated DRC software (i.e., DRC tool). FIG. 2 shows a conventional solution to this problem. As shown, for a design layout database 202 which includes a complex circuit, complex custom rules may be written into a DRC rules file 204 for a DRC tool 206. A special masking layer may be added to a design layout to identify to the tool 206 which areas of the chip need the special rule checks. After the DRC tool 206 completes the check, an error results database 208 may be used to store the result. When the rules are too complex, manual inspection may substitute for automated DRC software. However, complex custom rules are very difficult and time consuming to write and verify. In addition, manually adding masking layers to the design layout is an error prone process. Moreover, manual inspection of the layout database is also an error prone process.

Thus, it would be desirable to provide a system and method which may effectively address the foregoing-described problems.

SUMMARY OF THE INVENTION

In an aspect, the present invention provides a method for performing design rule check (DRC) of an integrated circuit. A design layout of the integrated circuit is provided. The integrated circuit includes a complex circuit. A DRC tool is used to compare a portion of the design layout with a reference layout containing an accurate implementation of the complex circuit. The portion of the design layout corresponds to the complex circuit.

In an additional aspect, the present invention provides a system for performing design rule check (DRC) of an integrated circuit. The system includes means for providing a design layout of the integrated circuit, the integrated circuit including a complex circuit; and means for comparing, by a DRC tool, a portion of the design layout with a reference layout containing an accurate implementation of the complex circuit, the portion of the design layout corresponding to the complex circuit.

It is to be understood that both the foregoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the presently preferred embodiments of the invention, examples of which are illustrated in the accompanying drawings.

Figure 1:
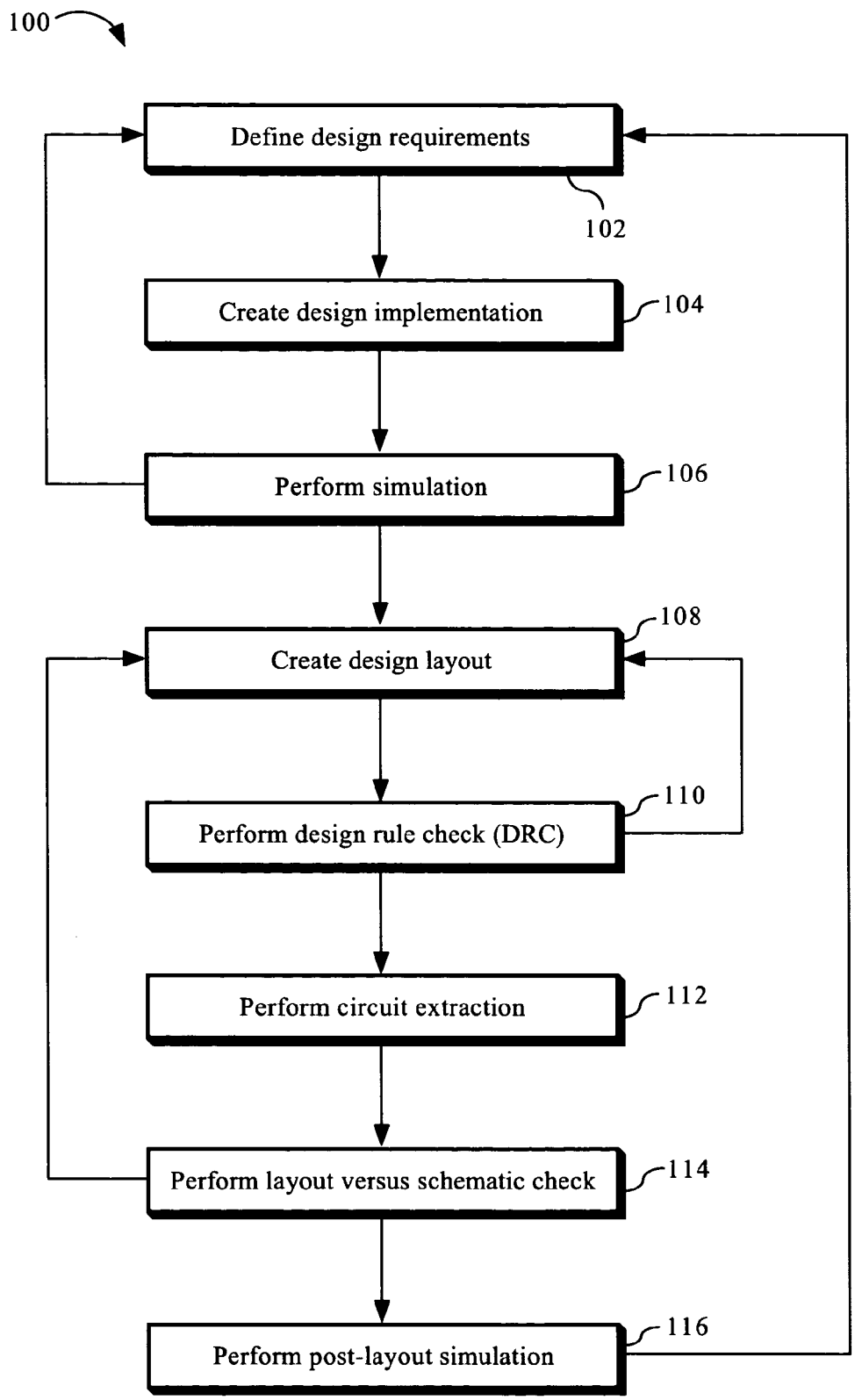
FIG. 1 illustrates an exemplary prior art design flow for an integrated circuit.
Figure 2:
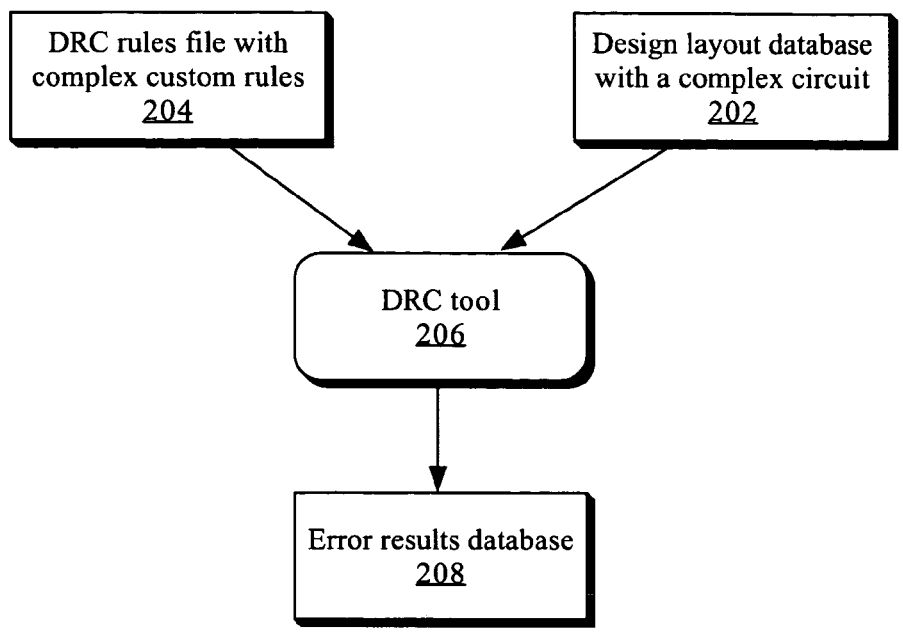
FIG. 2 is a schematic diagram illustrating a prior art method for performing DRC of an integrated circuit, which includes a complex circuit.
Figure 3:
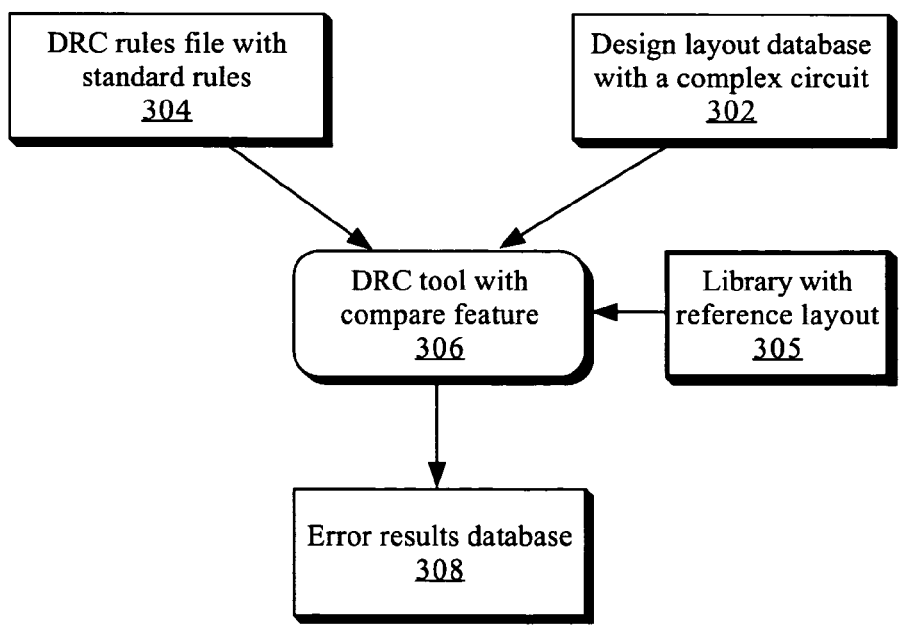
FIG. 3 is a schematic diagram illustrating a method for performing DRC of an integrated circuit, which includes a complex circuit, in accordance with an exemplary embodiment of the present invention.

Referring now to FIG. 3, a schematic diagram is provided to illustrate a method for performing DRC of an integrated circuit, which includes a complex circuit, in accordance with an exemplary embodiment of the present invention. As shown, for a design layout database 302 which includes a complex circuit, the DRC rules file 304 which includes standard files may be used by a DRC tool 306 with compare features to check the majority of the layout. For the complex circuit, rather than apply the standard rules, the layout is compared against a reference layout stored in a library 305. This may verify that the full layout incorporates the complex circuit correctly. After the DRC tool 306 completes the check, an error results database 308 may be used to store the result.

Thus, in one embodiment of the present invention, the DRC tool may have the ability to compare a portion of a layout database, which corresponds to a complex circuit, with a reference layout containing an accurate implementation of the complex circuit. The portion of the layout corresponding to the complex circuit may be identified by name or by coordinates. The DRC tool may perform this check in addition to applying the standard rules to the rest of the layout.

Figure 4:
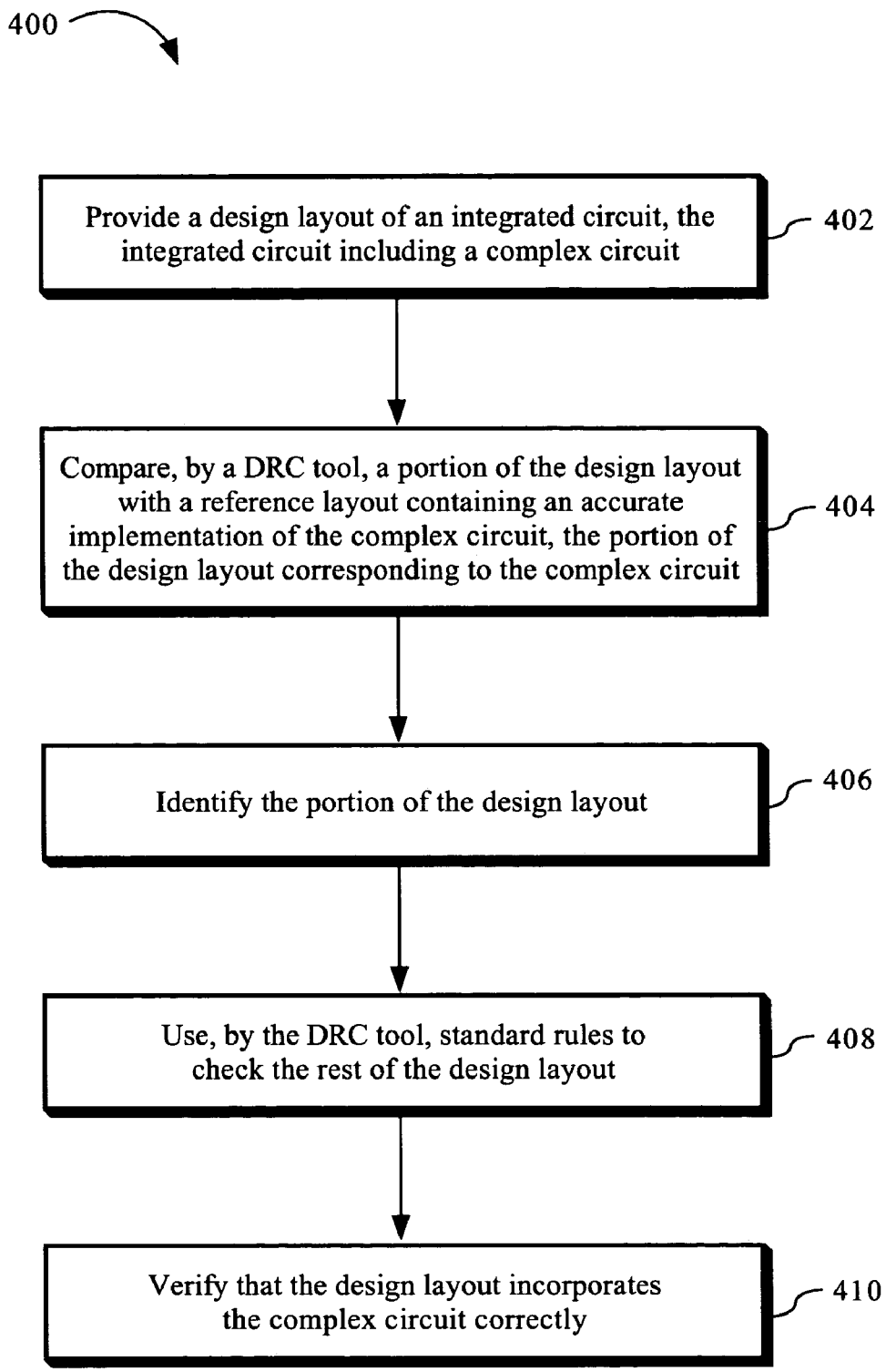
FIG. 4 is a flowchart of a method for performing DRC of an integrated circuit, which includes a complex circuit, in accordance with an exemplary embodiment of the present invention.

FIG. 4 is a flowchart of a method 400 for performing DRC of an integrated circuit, which includes a complex circuit, in accordance with an exemplary embodiment of the present invention. A design layout of an integrated circuit is provided, where the integrated circuit includes a complex circuit 402. The design layout may be stored in a database. A DRC tool is used to compare a portion of the design layout with a reference layout containing an accurate implementation of the complex circuit, where the portion of the design layout corresponds to the complex circuit 404. The reference layout may be stored in a library. The portion of the design layout may be identified by name, coordinates, or the like 406. The DRC tool may use the standard rules to check the rest of the design layout 408. It is verified that the design layout incorporates the complex circuit correctly 410.

The present invention may have the following advantages. First, it may allow for simple checking of very complex, custom circuits without relying on time consuming custom rule writing or error prone manual checking. Moreover, it may improve turn around time for DRC verification and require fewer computer resources.

It is to be noted that the foregoing described embodiments according to the present invention may be conveniently implemented using conventional general purpose digital computers programmed according to the teachings of the present specification, as will be apparent to those skilled in the computer art. Appropriate software coding may readily be prepared by skilled programmers based on the teachings of the present disclosure, as will be apparent to those skilled in the software art.

It is to be understood that the present invention may be conveniently implemented in forms of a software package. Such a software package may be a computer program product which employs a computer-readable storage medium including stored computer code which is used to program a computer to perform the disclosed function and process of the present invention. The computer-readable medium may include, but is not limited to, any type of conventional floppy disk, optical disk, CD-ROM, magneto-optical disk, ROM, RAM, EPROM, EEPROM, magnetic or optical card, or any other suitable media for storing electronic instructions.

It is understood that the specific order or hierarchy of steps in the processes disclosed is an example of exemplary approaches. Based upon design preferences, it is understood that the specific order or hierarchy of steps in the processes may be rearranged while remaining within the scope of the present invention. The accompanying method claims present elements of the various steps in a sample order, and are not meant to be limited to the specific order or hierarchy presented.

It is believed that the present invention and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A method for performing design rule check (DRC) of an integrated circuit, comprising:

providing a design layout of said integrated circuit, said integrated circuit including a complex circuit;

checking, by a DRC tool, a first portion of said design layout against a set of design rules to check said first portion of said design layout, said first portion of said design layout not including said complex circuit; and comparing, by the DRC tool, a second portion of said design layout, which has not been checked against the set of design rules, with a reference layout containing an accurate implementation of said complex circuit, said second portion of said design layout corresponding to said complex circuit.

2. The method of claim 1, further comprising identifying said second portion of said design layout.

3. The method of claim 2, wherein said second portion of said design layout is identified by name.

4. The method of claim 2, wherein said second portion of said design layout is identified by coordinates.

5. The method of claim 1, further comprising verifying that said design layout incorporates said complex circuit correctly.

6. The method of claim 1, wherein said design layout is stored in a database, and said reference layout is stored in a library.

7. A computer-readable medium having computer-executable instructions for implementing a method for performing design rule check (DRC) of an integrated circuit, said method comprising:
  providing a design layout of said integrated circuit, said integrated circuit including a complex circuit;
  checking, by a DRC tool, a first portion of said design layout against a set of design rules to check said first portion of said design layout, said first portion of said design layout not including said complex circuit; and
  comparing, by the DRC tool, a second portion of said design layout, which has not been checked against the set of design rules, with a reference layout containing an accurate implementation of said complex circuit, said second portion of said design layout corresponding to said complex circuit.

8. The computer-readable medium of claim 7, wherein said method further comprises identifying said second portion of said design layout.

9. The computer-readable medium of claim 8, wherein said second portion of said design layout is identified by name.

10. The computer-readable medium of claim 8, wherein said second portion of said design layout is identified by coordinates.

11. The computer-readable medium of claim 7, wherein said method further comprises verifying that said design layout incorporates said complex circuit correctly.

12. The computer-readable medium of claim 7, wherein said design layout is stored in a database, and said reference layout is stored in a library.

13. A system for performing design rule check (DRC) of an integrated circuit, comprising:
  means for providing a design layout of said integrated circuit, said integrated circuit including a complex circuit;
  checking, by a DRC tool, a first portion of said design layout against a set of design rules to check said first portion of said design layout, said first portion of said design layout not including said complex circuit; and
  means for comparing, by the DRC tool, a second portion of said design layout, which has not been checked against the set of design rules, with a reference layout containing an accurate implementation of said complex circuit, said second portion of said design layout corresponding to said complex circuit.

14. The system of claim 13, further comprising means for identifying said second portion of said design layout by name.

15. The system of claim 13, further comprising means for identifying said second portion of said design layout by coordinates.

16. The system of claim 13, further comprising means for verifying that said design layout incorporates said complex circuit correctly.

17. The system of claim 13, wherein said design layout is stored in a database, and said reference layout is stored in a library.

* * * * *